United States Patent [19]

Linebarger et al.

[11] Patent Number: 5,684,414
[45] Date of Patent: Nov. 4, 1997

[54] VOLTAGE LEVEL INTERFACE CIRCUIT WITH SEPARATE REFERENCE SIGNAL INPUT AND FOLDED CASCODE STRUCTURE

[75] Inventors: Daniel J. Linebarger; Nasrollah Saeed Navid, both of Saratoga, Calif.

[73] Assignee: U.S. Philips Corporation, New York, N.Y.

[21] Appl. No.: 594,618

[22] Filed: Feb. 2, 1996

[51] Int. Cl.$^6$ .................................................. H03K 19/018
[52] U.S. Cl. ............................ 326/75; 326/33; 326/80; 326/126
[58] Field of Search .................................. 326/33, 63, 75, 326/77, 78, 80, 126–127

[56] References Cited

U.S. PATENT DOCUMENTS

| | | | |
|---|---|---|---|
| 4,700,087 | 10/1987 | Stroberger | 326/75 |
| 4,931,673 | 6/1990 | Naghshineh | 326/77 |
| 5,148,059 | 9/1992 | Chen et al. | 326/78 X |
| 5,541,539 | 7/1996 | Schlachter | 327/78 |

*Primary Examiner*—David R. Hudspeth
*Attorney, Agent, or Firm*—Brian J. Wieghaus

[57] ABSTRACT

A low-voltage, high-speed voltage level interface circuit for signal level translation between circuits operating at different supply voltages. The circuit utilizes a folded cascode structure with a separate reference voltage to achieve high-speed and low-voltage performance. Voltage divider circuits are provided at the signal and reference inputs.

10 Claims, 3 Drawing Sheets

VOLTAGE LEVEL INTERFACE CIRCUIT WITH SEPARATE REFERENCE SIGNAL INPUT AND FOLDED CASCODE STRUCTURE

This invention relates to electrical circuits, and in particular to an interface electrical circuit for translating a signal having different voltage levels.

BACKGROUND OF THE INVENTION

Analog and digital circuits fabricated together on a monolithic substrate can have separate supply voltages to reduce noise coupling between the two supplies or for enhancing the performance of an input or output stage with a higher supply voltage.

Also, higher system integration in low power radio-frequency (RF) equipment requires that different supply voltages connect to separate subsystems. Sending signals from a subsystem powered by one supply voltage must be translated to the different supply voltage of the second subsystem without sacrificing speed.

FIG. 1 shows an emitter follower circuit which can be used for translating a signal between two dissimilar supplies. A differential input voltage, called $V_s$, which is referenced to supply voltage $V_1$, has a maximum input amplitude of $V_H = V_1$ and a minimum amplitude of $V_L = V_{L1}$ at either input IN, INB. The input signal is divided down by resistors R1 and R2 to the bases of transistors Q3 and Q4. The transistors Q3 and Q4 form a differential pair that will amplify the divided input signal and provide a differential output, $V_O$, at their collectors which is referenced to supply voltage $V_2$.

The circuit of FIG. 1 is fast but only works within limited supply ranges as it combines the signal path with the biasing of the input common-mode voltage. When the supply $V_1$ is nearly equal to that of the supply $V_2$, the input bias voltage to the bases of Q3 and Q4 can, for example, be: given that R1=2K, R2=8K, RL=1K, I=200 uA, then for $V_1$=2.7V, $V_2$=3.0V, $V_{BE}$=0.8V, and for $V_{IN}$=VH=$V_1$, the voltage at the base of Q3 becomes:

$$V_{B3} = (R2/(R1+R2))(V_1 - V_{BE1}) = (8/10)(2.7-0.8) = 1.52V \quad (1)$$

and the voltage at the emitter of Q3, which is the compliance voltage of the current source, 1, is:

$$V_{E3} = V_{B3} - V_{BE3} = 1.52 - 0.8 = 0.720V \quad (2)$$

This circuit will work fine for most cases where $V_1$ is equal to or less than $V_2$. However, for $V_1$ greater than that of $V_2$, for example, $V_1$=5.5V and $V_2$=2.7V then:

$$V_{B3} = (R2/(R1+R2))(V_1 - V_{BE1}) = (8/10)(5.5-0.8) = 3.76V \quad (3)$$

The value of $V_{B3}$ is now greater than the value of the supply voltage $V_2$ and will forward bias the collector-base diode of the input transistor Q3. Under such conditions, the FIG. 1 circuit becomes inoperable.

SUMMARY OF INVENTION

An object of the invention is an improved voltage level interface circuit.

Another object of the invention is a high-speed signal level translation circuit for two different supply voltages.

A further object of the invention is a low-voltage, high-speed, bipolar voltage level interface circuit.

In accordance with one aspect of the invention, an improved voltage level interface circuit comprises a folded cascode structure with a separate reference voltage circuit to achieve high-speed and low-voltage performance. By separating the input voltage circuit from the reference voltage circuit, the output voltage is made substantially independent of input voltage swings in differential versions of the circuit of the invention. Moreover, in a single-ended version of the circuit of the invention as well as in the differential version, it is possible to control more accurately the output voltage.

In accordance with another aspect of the invention, by introducing both the input signal voltage as well as the reference voltage via separate voltage divider circuits, the resultant circuit allows for a larger range in variations in the supply voltages, which improves the versatility of the circuit of the invention.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, the same or similar components being designated by the same reference numerals.

DETAILED DESCRIPTION OF PREFERRED EMBODIMENTS

Figure 1:
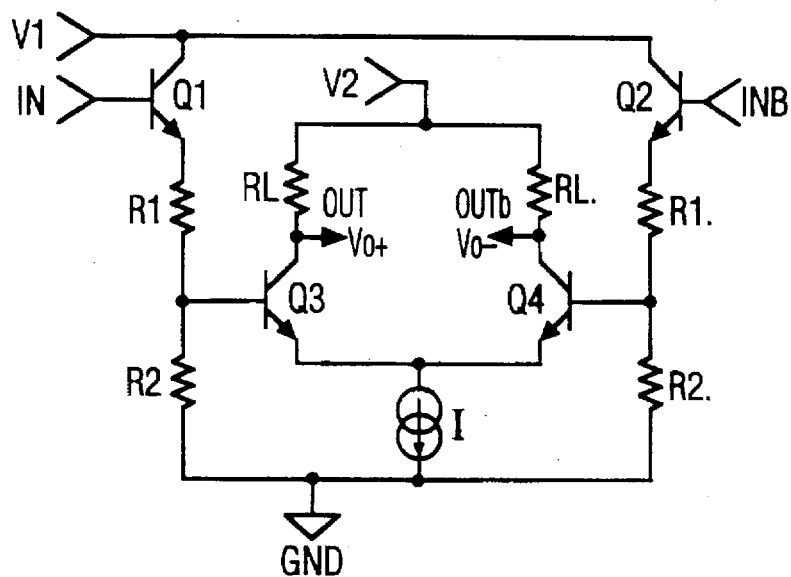
FIG. 1 is a known voltage level interface circuit using an emitter follower method.
Figure 2:
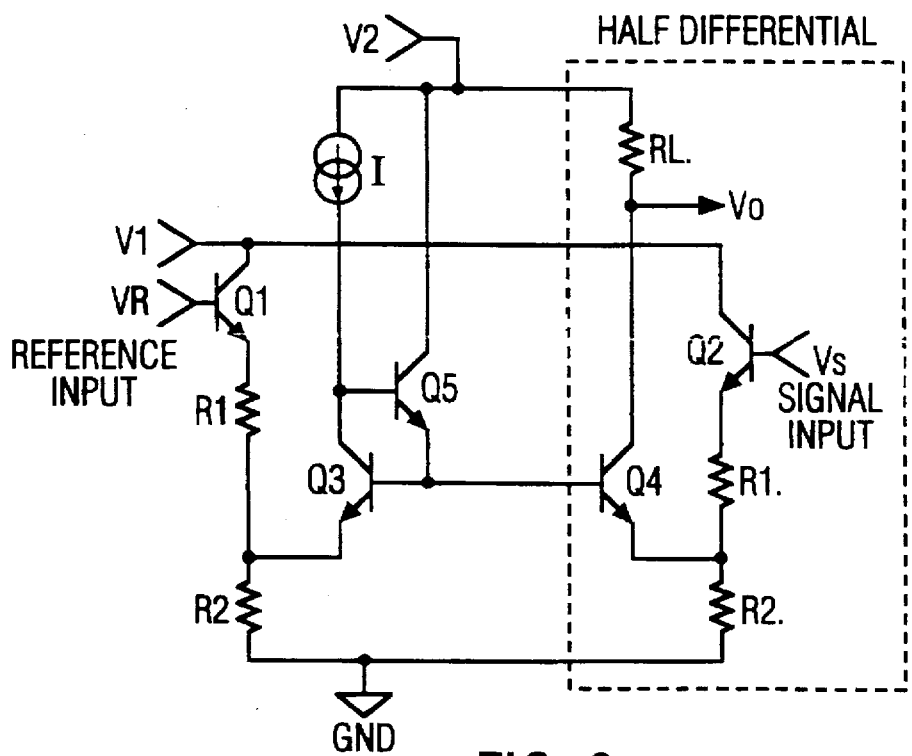
FIG. 2 is one form of voltage level interface circuit according to the invention, of the single ended type.

FIG. 2 shows the basic principle of a voltage level interface circuit according to the present invention. This circuit utilizes a folded cascode structure with a separate reference voltage source to achieve its high speed and low-voltage performance goals. The reference voltage, $V_R$, is defined as $(V_1 - V_{L1})$ and is divided down by the resistive voltage divider circuit R1 and R2 to the emitter of Q3, where:

$$V_{E3} = (R2/(R1+R2))(V_1 - V_{L1} - V_{BE1}), \quad (4)$$

similarly for $V_s = V_1 - V_{L1}$:

$$V_{E4} = (R2/(R1+R2))(V_1 - V_{L1} - V_{BE2}). \quad (5)$$

When $V_{E3} = V_{E4}$ the current in the collector of transistor Q4 is equal to 1 by the mirror transistor Q3 which yields an output voltage:

$$V_O = V_2 - I \times R_L. \quad (6)$$

For $V_s = V_H = V_1$ then:

$$V_{E4} = (R2/(R1+R2))(V_1 - V_{BE2}). \quad (7)$$

Since $V_{E4}$ is greater than $V_{E3}$ by an amount $V_{L1}$, the transistor Q4 is driven to the off state and the voltage at Vo is equal to $V_2$.

The compliance range will be defined as the voltage across the collector-base junction of transistor Q4, $V_{CB4}$. $V_{CB4}=(V_2-V_{L2})-(V_{E3}+V_{BE3})$, where $V_{L2}=I\times R_L$, which expands to $$V_{CB4}=V_2-V_{L2}-(R2/(R1+R2))(V_1-V_{L1}-V_{BE1})-V_{BE3}. \quad (8)$$

When the supply voltage $V_1$ is greater than $V_2$, for example if R1=10K, R2=5K, $V_{L1}$=400 mV, $V_{L2}$=160 mV, $V_{BE}$=0.8, $V_1$=5.5V and $V_2$=2.7V, the compliance range is $$V_{CB4}=2.7-0.16-(\tfrac{1}{3})(5.5-0.4-0.8)-0.8=300\ \text{mV}, \quad (9)$$

and for $V_1$=2.7 V and $V_2$=5.5 V, under otherwise the same conditions, the compliance range is:

$$V_{CB4}=5.5-0.16-(\tfrac{1}{3})(2.7-0.4-0.8)-0.8=4\ \text{V}. \quad (10)$$

Note that this circuit maintains $V_{CB4}$ large enough to prevent the collector junction from being forward biased, which is necessary for proper operation. Moreover, the compliance range remains within acceptable limits.

FIG. 2 illustrates a circuit with a single-ended input, Vs, and a single-ended output, Vo. In many applications, however, a circuit with differential inputs and differential outputs is wanted. The box labelled "Half Differential" indicates that a differential version can be obtained by simply duplicating what is in the box.

Figure 3:
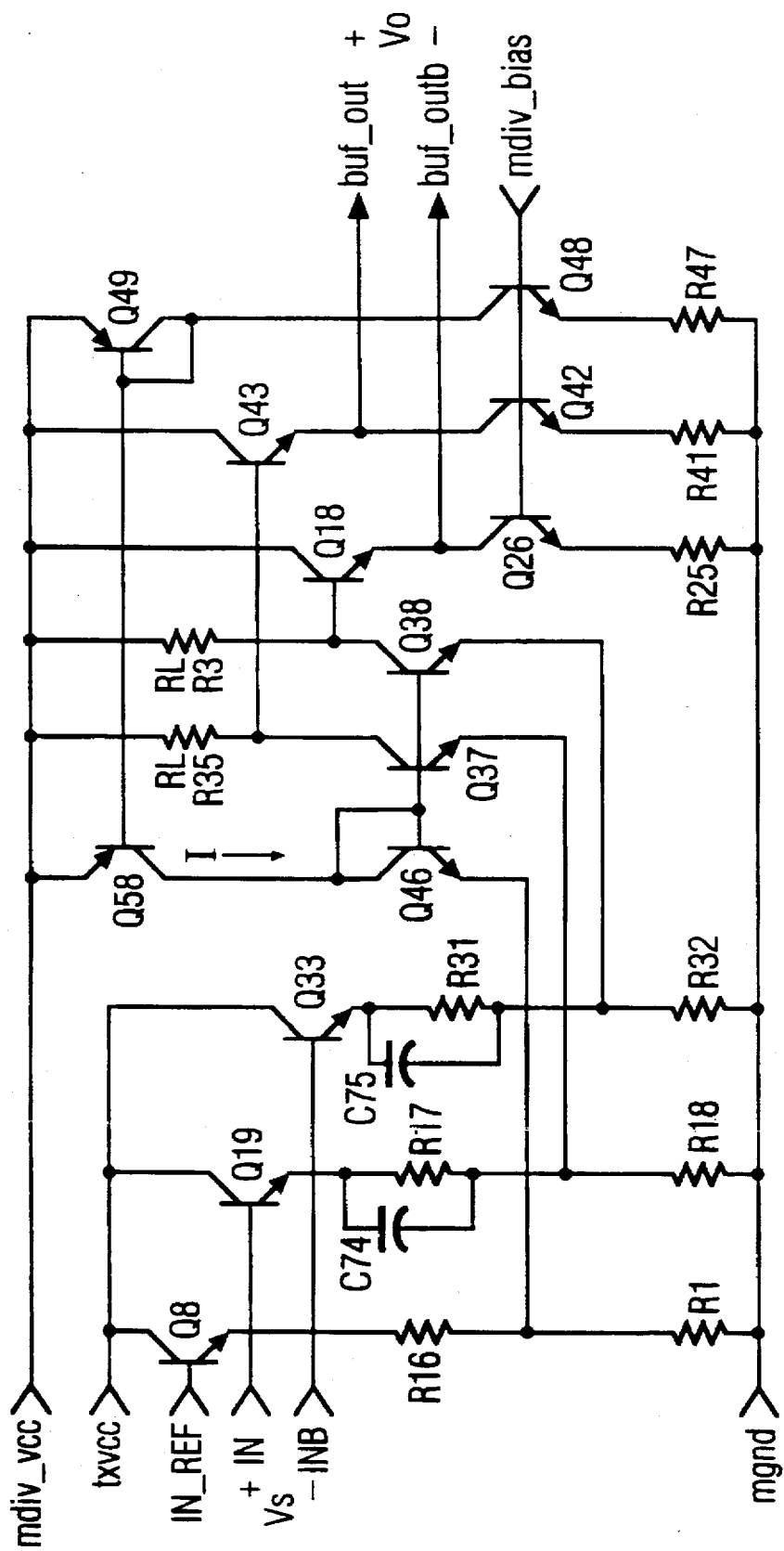
FIG. 3 is another form of voltage lever interface circuit according to the invention, of the differential type.

FIG. 3 shows a schematic of a more sophisticated form of a differential version of the voltage level interface according to the invention. In this case, transistor Q5 in FIG. 2 has been removed and replaced by a diode connected transistor, as shown in FIG. 3, Q46. Capacitors C74 and C75 have been added to improve the speed of the circuit for large values of attenuation resistors, the voltage dividers R17/R18 for the positive input signal voltage $V_s$+, and R31/R32 for the negative input signal voltage $V_s$−. Note also that a similar voltage divider circuit, R16/R1, is provided for the reference voltage VR supplied at terminal IN__REF.

The correspondence of parts in FIG. 2 to that in FIG. 3 is shown in the table below:

| FIG. 2 Part | Corresponds to | FIG. 3 Part |
| --- | --- | --- |
| V1 | | txvcc |
| V2 | | mdiv__vcc |
| VR | | IN__REF |
| Q1 | | Q8 |
| Q5 | | Q46 |
| R1 | | R16 |
| R2 | | R1 |
| Q3 | | Q46 |
| Q4 | | Q37,38 |
| I | | Q58 |
| GND | | mgnd |

Transistors Q18 and Q43 serve as output drivers for their respective negative (buf__out) and positive (buf__out) outputs $V_o$. Transistors Q26, Q42 and Q48 with their respective emitter resistors R25, R41 and R47 serves to control the bias on the output drivers Q18 and Q43 and on Q58 via current mirror Q49 by way of input bias signal mdiv__bias. This represents an important advantage in that the current source Q58 for the input signal transistors Q37, Q38 has its bias under separate control from any convenient precision current source and thus does not depend on and is not affected by common mode variations of the differential input signal voltages.

In the FIG. 3 circuit, when txvcc=5.5 V and mdiv__vcc= 2.7 V, a typical value for mdiv__bias=0.9 V; conversely, when the supply voltages are reversed, mdiv__bias=0.9 V.

The circuit of FIG. 3 offers the advantages that it will translate a switching signal referenced to a supply voltage V1/txvcc to a supply voltage V2/mdiv__vcc that may be less than, equal to, or greater than V1 without degrading the input signal Vs. Further, the output voltage swing, Vo, can be set independently of the input signal amplitude. The output voltage swing is Vo=I×$R_L$, where I is the bias current. Since I is readily and accurately controlled by mdiv__bias, the output voltage $V_o$ will be proportional to the current I flowing through the diode-connected transistor Q46. Further, the circuit will handle a larger range of variations in the supply voltages due to the presence of the voltage dividers in the input and reference voltage circuits.

Figure 4:
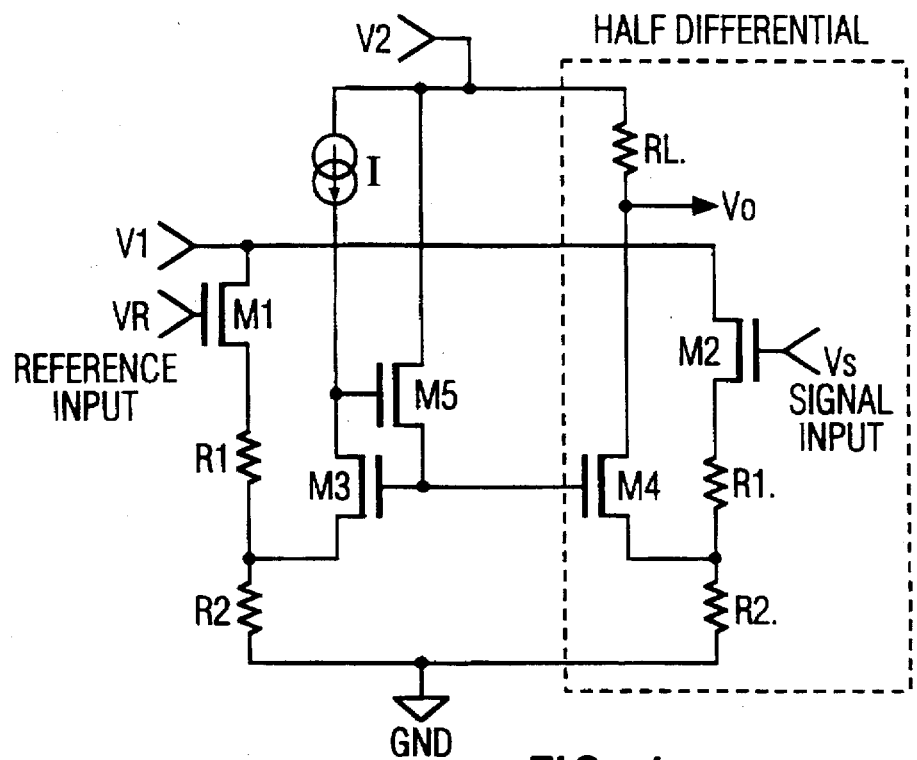
FIG. 4 is still another form of voltage level interface circuit according to the invention, but in this case using MOS transistors.
Figure 5:
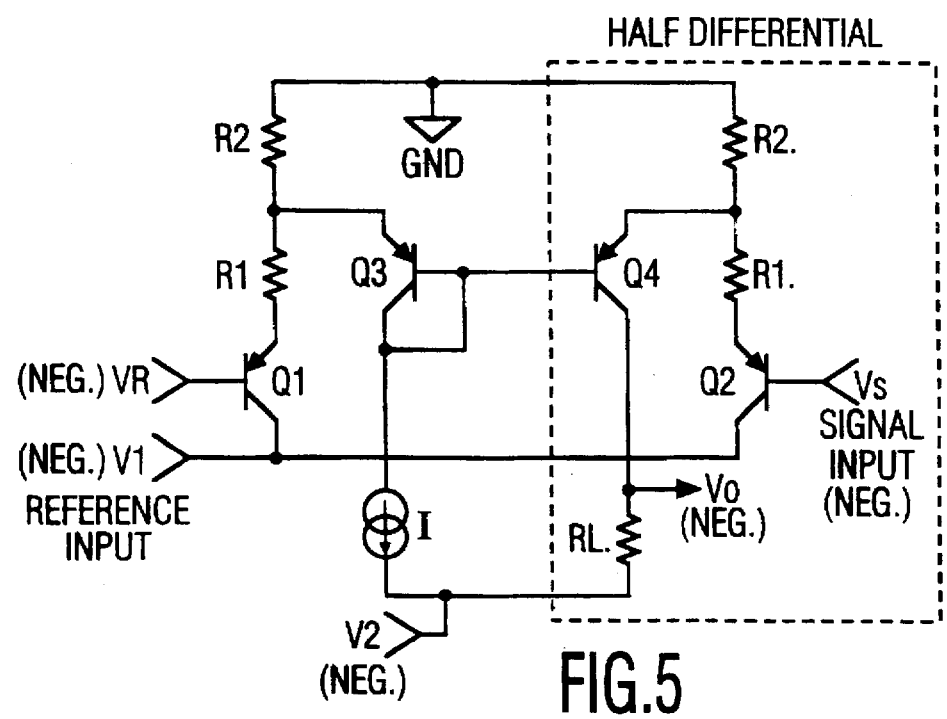
FIG. 5 is still another form of voltage level interface circuit according to the invention, but in this case using PNP bipolar transistors.

The invention is not limited to the bipolar circuits shown in FIGS. 2 and 3. Equivalent NMOS or CMOS circuits using the basic principle of the folded cascode structure with a separate reference voltage may be readily constructed by those skilled in the art following the teachings found herein. FIG. 4 shows an NMOS equivalent circuit to that illustrated in FIG. 2. As will be noted, the circuit is virtually identical to the FIG. 2 bipolar circuit except that NMOS transistors with M prefixes have been substituted for their bipolar counterparts. Similarly, the principles described herein are readily applied to bipolar PNP circuits as well as to mixed or composite NPN and PNP circuits. For example, FIG. 5 shows a comparable circuit implemented with PNP transistors. The notation used is the same as in FIG. 2, except that V1 and V2 will have negative values. Hence, the FIG. 5 circuit can be used to interface a reference voltage referenced to one negative voltage to an output referenced to another negative voltage. For the composite circuit (FIG. 6) case, where Q1 and Q2 are PNP and Q3 and Q4 are NPN transistors, for example, the circuit would be similar with a common ground, except that the reference voltage VR will be referenced to a negative voltage source V1 while the output Vo is referenced to a positive voltage source V2. Such a circuit will be useful where negative and positive sources are active. Similarly, for a composite circuit using both types of transistors (FIG. 7), the common ground (gnd) can be replaced by a third voltage V3 which may be useful in certain situations. In this case, the circuit will be similar except that: where V1 is negative and V2 is positive, then V2>|V3|>V1, and where V1 and V2 are positive, then V3<V2 and V1<V3. Thus, again, this will allow different voltage value and polarity references of the reference VR and output Vo signals. This further demonstrates the versatility of the circuit of the invention.

For completeness' sake, the folded cascode structure which typically comprises an emitter follower driving a common base circuit is represented by transistors Q1/Q3 and Q2/Q4 in FIGS. 2 and 5; by transistors Q8/Q46, Q19/Q37, and Q33/Q38 in FIG. 3; and M1/M3 and M2/M4 in FIG. 4.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A voltage level interface circuit comprising:
   (a) a first circuit having a signal input circuit and output,
   (b) a first supply voltage connected to and supplying a voltage $V_1$ to operate the first circuit,
   (c) a second circuit having signal input and output,
   (d) a second supply voltage connected to and supplying a voltage $V_2$ to operate the second circuit,
   (e) $V_1$ not being equal to $V_2$, (f) means connecting the first circuit signal input to receive an input signal $V_s$, (g) means connecting the first circuit signal output to the second circuit signal input, (h) means connecting the second circuit signal output to output an output signal $V_o$, (i) said first circuit having a reference signal circuit with a reference input separate from the first circuit signal input circuit, (j) means connecting a reference signal to the first circuit reference input; and (k) said first and second circuits form a folded cascode structure.

2. The circuit of claim 1, wherein $V_1 > V_2$.

3. The circuit of claim 1, wherein $V_2 > V_1$.

4. The circuit of claim 1 wherein the first circuit comprises first and second voltage dividers with the first voltage divider connected to the reference input and the second voltage divider connected to the signal input.

5. The circuit of claim 4, wherein the second circuit comprises a current source, a first transistor connected to the current source and having an emitter or source connected to the first voltage divider, a load, a second transistor connected to the load and having an emitter or source connected to the second voltage divider.

6. The circuit of claim 5, wherein the current source comprises a transistor, and further comprising a biasing source separate from signal paths in the first circuit and connected to the current source transistor.

7. A voltage level interface circuit comprising:

(a) a first circuit having a signal input circuit and output, (b) a first supply voltage connected to and supplying a voltage $V_1$ to operate the first circuit, (c) a second circuit having signal input and output, (d) a second supply voltage connected to and supplying a voltage $V_2$ to operate the second circuit, (e) $V_1$ being greater than $V_2$, (f) means connecting the first circuit signal input to receive an input signal $V_s$, (g) means connecting the first circuit signal output to the second circuit signal input, (h) means connecting the second circuit signal output to output an output signal $V_o$, (i) said first circuit having a reference signal circuit with a reference input separate from the first circuit signal input circuit, and (j) means connecting a reference signal to the first circuit reference input.

8. In a level shifting circuit comprising first and second circuits operating at different supply voltages and having a signal input to the first circuit and a signal output from the second circuit, the improvement comprising:

(a) said first and second circuits forming a cascode structure that provides a signal path from the signal input to the signal output, (b) a reference circuit, separate from the said signal path and connected to the second circuit, for receiving a reference voltage for controlling the operation of said second circuit.

9. The circuit of claim 8, further comprising first and second voltage dividers with the first voltage divider connected to the reference circuit and the second voltage divider connected to the signal input.

10. The circuit of claim 9, wherein said supply voltages have different voltage values or polarities.

* * * * *